(12) United States Patent
Kumar et al.

(10) Patent No.: US 8,877,550 B2
(45) Date of Patent: Nov. 4, 2014

(54) METHODS FOR FORMING RESISTIVE SWITCHING MEMORY ELEMENTS BY HEATING DEPOSITED LAYERS

(75) Inventors: Pragati Kumar, Santa Clara, CA (US); Sean Barstow, San Jose, CA (US); Sunil Shanker, Santa Clara, CA (US); Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 457 days.

(21) Appl. No.: 13/371,220

(22) Filed: Feb. 10, 2012

(65) Prior Publication Data

US 2012/0142143 A1 Jun. 7, 2012

Related U.S. Application Data

(63) Continuation of application No. 12/400,655, filed on Mar. 9, 2009, now Pat. No. 8,143,092.

(60) Provisional application No. 61/035,354, filed on Mar. 10, 2008.

(51) Int. Cl.
*H01L 45/00* (2006.01)
*H01L 27/04* (2006.01)
*H01L 27/24* (2006.01)

(52) U.S. Cl.
CPC .............. *H01L 45/04* (2013.01); *H01L 45/146* (2013.01); *H01L 45/1633* (2013.01); *H01L 27/2463* (2013.01); *H01L 45/1233* (2013.01); *H01L 27/2409* (2013.01)
USPC ........................................................ 438/104

(58) Field of Classification Search
CPC . H01L 45/1633; H01L 45/04; H01L 45/1233; H01L 45/1253; H01L 45/14; H01L 45/146; H01L 45/16; H01L 45/1608; H01L 27/2463; H01L 27/2409
USPC ............ 438/104, 761, 762, 765, 768; 257/43, 257/E45.002, E45.003
See application file for complete search history.

(56) References Cited

U.S. PATENT DOCUMENTS

| | | | | |
|---|---|---|---|---|
| 3,795,977 | A | * | 3/1974 | Berkenblit et al. .......... 29/25.02 |
| 3,796,926 | A | * | 3/1974 | Cole et al. .......................... 257/4 |
| 8,154,003 | B2 | * | 4/2012 | Lee et al. ............................ 257/4 |
| 8,502,198 | B2 | * | 8/2013 | Williams et al. ................ 257/40 |
| 2006/0281274 | A1 | * | 12/2006 | Verhoeven ..................... 438/309 |
| 2009/0109727 | A1 | * | 4/2009 | Fang et al. ....................... 365/148 |
| 2009/0152526 | A1 | * | 6/2009 | Courtade et al. .................. 257/4 |
| 2009/0163018 | A1 | * | 6/2009 | Avanzino et al. ............. 438/600 |
| 2009/0186443 | A1 | * | 7/2009 | Joseph et al. .................. 438/104 |
| 2010/0085142 | A1 | * | 4/2010 | Hosoi ............................. 338/20 |

* cited by examiner

*Primary Examiner* — Michele Fan

(57) ABSTRACT

Resistive switching nonvolatile memory elements are provided. A metal-containing layer and an oxide layer for a memory element can be heated using rapid thermal annealing techniques. During heating, the oxide layer may decompose and react with the metal-containing layer. Oxygen from the decomposing oxide layer may form a metal oxide with metal from the metal-containing layer. The resulting metal oxide may exhibit resistive switching for the resistive switching memory elements.

10 Claims, 6 Drawing Sheets

METHODS FOR FORMING RESISTIVE SWITCHING MEMORY ELEMENTS BY HEATING DEPOSITED LAYERS

CROSS-REFERENCE TO RELATED APPLICATION

This application is a continuation application and claims priority to U.S. application Ser. No. 12/400,655 filed on Mar. 9, 2009. Furthermore, a claim for priority is hereby made under the provisions of 35 U.S.C. §119 for the present application based upon U.S. Provisional Application No. 61/035,354 entitled "Methods for Forming Resistive Switching Memory Elements by Heating Deposited Layers" and filed on Mar. 10, 2008, which is incorporated herein by reference.

FIELD OF THE INVENTION

This invention relates to nonvolatile memory elements, and more particularly, to methods for forming nonvolatile resistive switching memory elements.

BACKGROUND OF THE INVENTION

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly small dimensions. However, as device dimensions shrink, scaling issues are posing challenges for traditional nonvolatile memory technology. This has lead to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of voltage pulses. Nondestructive read operations can be performed to ascertain the value of a data bit that is stored in a memory cell.

Nonvolatile memory elements can be formed using metal oxides. Resistive switching based on nickel oxide switching elements and noble metal electrodes such as platinum electrodes has been demonstrated.

In a typical scenario, a stack of resistive switching oxide and electrode layers is deposited using physical vapor deposition (PVD) (sputtering). Dry etching is then used to pattern the deposited layers. Heat may be applied to the deposited structures during this type fabrication process.

Arrangements such as these may be satisfactory, but can give rise to processing challenges. For example, multilayer materials that undergo high temperature treatments may lose interfacial integrity due to interdiffusion or stress-induced delamination.

Moreover, the use of conventional rapid thermal oxidation processes or other such post-processing oxidation techniques to form resistive switching metal oxide films may lead to undesirable oxidation of contact pads or other device features.

It would therefore be desirable to be able to provide improved techniques for forming resistive switching structures using thermal processes.

SUMMARY

In accordance with the present invention, nonvolatile memory elements are formed using in-situ processes. These in-situ processes can be used to avoid reliance on conventional rapid thermal oxidation techniques and other such post-processing oxidation techniques and may reduce process complexity.

The nonvolatile memory elements may contain layers of metal oxide that exhibit resistive switching. The resistive switching metal oxide layers may be formed by depositing oxide layers and metal-containing layers and by heating the deposited layers.

With one suitable arrangement, a metal-containing layer such as titanium nitride may be deposited. An oxide layer such as ruthenium oxide may be deposited on the metal-containing layer. A rapid thermal annealing tool or other equipment may be used to heat the oxide layer and the metal-containing layer. During heating, oxygen from the oxide layer can oxidize the metal from the metal-containing layer. For example, in a scenario in which a layer of ruthenium oxide that has been deposited on a layer of titanium nitride is heated, the oxygen from the ruthenium oxide layer may oxidize some of the titanium in the titanium nitride layer, thereby forming a resistive switching layer of titanium oxide. Layers of ruthenium and unoxidized titanium nitride may be formed above and below the titanium oxide layer as part of the heating process. If desired, this type of arrangement may be used to oxidize stacks of metal-containing layers. For example, an alternating arrangement of metal-containing layers and oxide layers may be deposited. Following heat treatment, each of the metal-containing layers may be oxidized by oxygen from one or more adjoining oxide layers. The metal-containing layers may be metals, metal alloys, metal nitrides, or any other suitable metal-containing materials.

Further features of the invention, its nature and various advantages will be more apparent from the accompanying drawings and the following detailed description.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Embodiments of the present invention relate to nonvolatile memory formed from resistive switching elements. Embodiments of the invention also relate to fabrication methods that may be used to form nonvolatile memory having resistive switching memory elements.

Resistive switching elements may be formed on any suitable type of integrated circuit. Most typically, resistive switching memory elements may be formed as part of a high-capacity nonvolatile memory integrated circuit. Nonvolatile memory integrated circuits are often used in portable devices such as digital cameras, mobile telephones, handheld computers, and music players. In some arrangements, a nonvolatile memory device may be built into mobile equipment such as a cellular telephone. In other arrangements, nonvolatile memory devices are packaged in memory cards or memory keys that can be removably installed in electronic equipment by a user.

The use of resistive switching memory elements to form memory arrays on memory devices is merely illustrative. In general, any suitable integrated circuit may be formed using the resistive switching structures of the present invention. Fabrication of memory arrays formed of resistive switching memory elements is described herein as an example.

Figure 1:
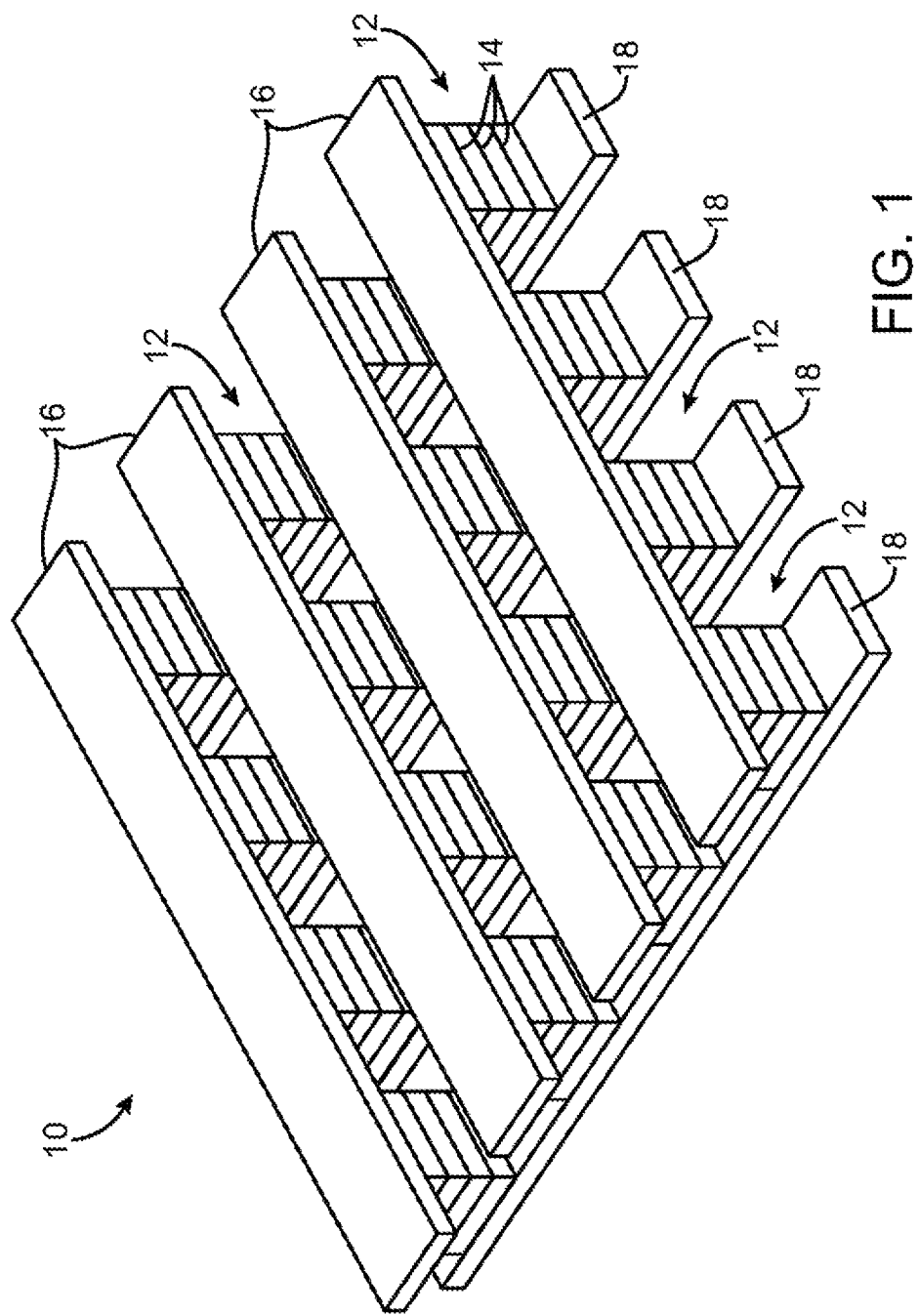
FIG. 1 is a diagram of an illustrative array of resistive switching memory elements in accordance with an embodiment of the present invention.

An illustrative memory array 10 of resistive switching memory elements 12 is shown in FIG. 1. Memory array 10 may be part of a memory device or other integrated circuit. Read and write circuitry may be connected to memory elements 12 using conductors 16 and orthogonal conductors 18. Conductors such as conductors 16 and conductors 18 are sometimes referred to as word lines and bit lines and are used to read and write data into the elements 12 of array 10. Individual memory elements 12 or groups of memory elements 12 can be addressed using appropriate sets of conductors 16 and 18. Memory element 12 may be formed from one or more layers of materials, as indicated schematically by lines 14 in FIG. 1. In addition, the memory arrays shown can be stacked in a vertical fashion to make multi-layer 3-D memory arrays.

During a read operation, the state of a memory element 12 can be sensed by applying a sensing voltage to an appropriate set of conductors 16 and 18. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic one (i.e., a "1" bit). If, on the other hand, the memory element has a low resistance, the memory element may be said to contain a logic zero (i.e., a "0" bit). During a write operation, the state of a memory element can be changed by application of suitable write signals to an appropriate set of conductors 16 and 18.

Figure 2A:
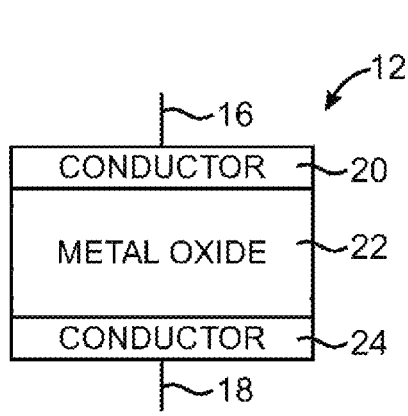
FIG. 2A is a cross-sectional view of an illustrative resistive switching nonvolatile memory element in accordance with an embodiment of the present invention.

A cross-section of an illustrative embodiment of a resistive switching memory element is shown in FIG. 2A. In the example of FIG. 2A, memory element 12 is formed from a metal oxide 22 and has conductive electrodes 20 and 24. When constructed as part of an array such as array 10 of FIG. 1, conductive lines such as lines 16 and 18 may be physically and electrically connected to electrodes 20 and 24. Such conductive lines and electrodes may be formed from any suitable conductive materials such as metals (e.g., tungsten, aluminum, copper, ruthenium, noble metals, near-noble metals, non-noble metals), metal silicides, metal nitrides (e.g., TiN), metal silicon nitrides, doped polysilicon, doped silicon, combinations of these materials, or any other suitable conductive materials.

If desired, conductive line 16 and conductive line 18 may serve as both conductive lines and as electrodes. In this type of arrangement, line 16 may serve as electrode 20, so that no separate conductor is needed to form an upper electrode for element 12. Similarly, line 18 may serve as electrode 24, so that no separate conductor is needed for the lower electrode of element 12.

In the diagram of FIG. 2A, conductive lines 16 and 18 are shown schematically as being formed in contact with electrodes 20 and 24. Other arrangements may be used if desired. For example, there may be intervening electrical components (e.g., diodes, p-i-n diodes, silicon diodes, silicon p-i-n diodes, transistors, etc.) that are formed between line 16 and electrode 20 or between line 18 and electrode 24.

Figure 2B:
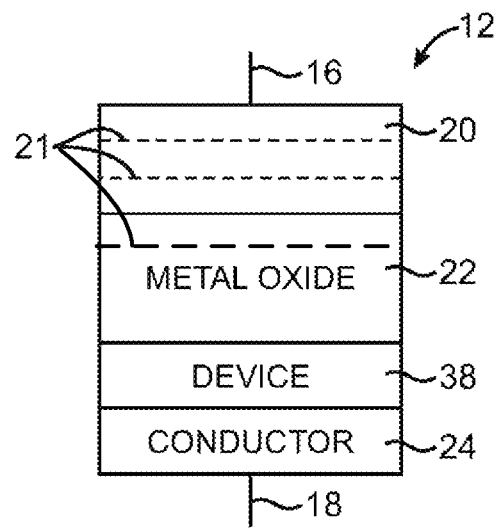
FIG. 2B is a cross-sectional view of an illustrative resistive switching nonvolatile memory element in accordance with another embodiment of the present invention.

If desired, there may be an intervening electrical component between an electrode and resistive switching metal oxide 22. An illustrative arrangement in which there is an intervening electrical component 38 between electrode 24 and metal oxide 22 is shown in FIG. 2B.

As indicated schematically by dotted lines 21, conductive materials such as conductive layers 24 and 20 and resistive switching layers such as metal oxide layer 22 may be formed from one or more layers of materials.

With one illustrative embodiment, metal oxide 22 may be formed from a binary metal oxide such as titanium oxide. With another illustrative embodiment, resistive switching may be provided using a layer of $TiO_xN_y$ (or $MO_xN_y$ where M is a metal) as part or all of resistive switch layer 22. These are merely illustrative examples. In general, resistive switching layer 22 may be formed using any suitable material that exhibits resistive switching.

Resistive switching memory element 12 may exhibit a bistable resistance. When resistive switching memory element 12 is in a high resistance state, it may be said to contain a logic one. When resistive switching memory element 12 is in a low resistance state, it may be said to contain a logic zero. (If desired, high resistance can signify a logic zero and low resistance can signify a logic one.) The state of resistive switching memory element 12 may be sensed by application of a sensing voltage. When it is desired to change the state of resistive switching memory element 12, read and write circuitry may apply suitable control signals across terminals 16 and 18.

Figure 3:
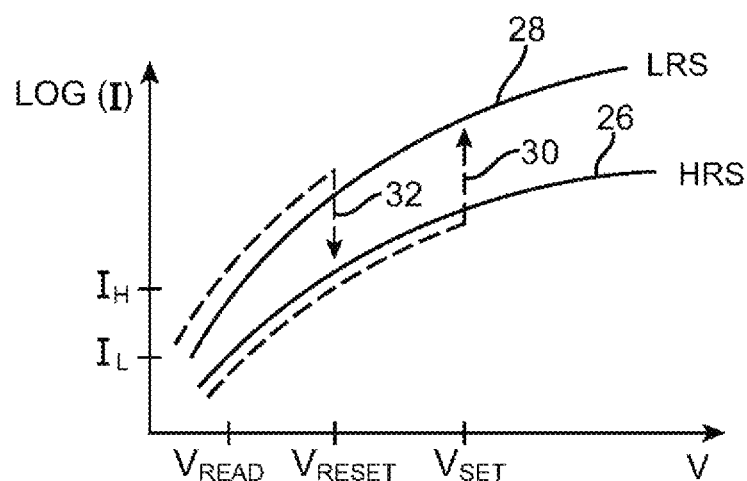
FIG. 3 is a graph showing how a resistive switching nonvolatile memory element of the types shown in FIGS. 2A and 2B may exhibit bistable behavior in accordance with an embodiment of the present invention.

A current (I) versus voltage (V) plot for device 12 is shown in FIG. 3. Initially, device 12 may be in a high resistance state (e.g., storing a logic one). In this state, the current versus voltage characteristic of device 12 is represented by solid line HRS 26. The high resistance state of device 12 can be sensed by read and write circuitry 14 (FIG. 1). For example, read and write circuitry 14 may apply a read voltage $V_{READ}$ to device 12 and can sense the resulting low current $I_L$ that flows through device 12. When it is desired to store a logic zero in device 12, device 12 can be placed into its low-resistance state. This may be accomplished by using read and write circuitry 14 to apply a voltage $V_{SET}$ across terminals 16 and 18 of device 12. Applying $V_{SET}$ to device 12 causes device 12 to enter its low resistance state, as indicated by dashed line 30. In this region, the structure of device 12 is changed (e.g., through the formation of current filaments through metal oxide 22 or other suitable mechanisms), so that, following removal of the voltage $V_{SET}$, device 12 is characterized by low resistance curve LRS 28.

The low resistance state of device 12 can be sensed using read and write circuitry 14. When a read voltage $V_{READ}$ is applied to resistive switching memory element 12, read and write circuitry 14 will sense the relatively high current value $I_H$, indicating that device 12 is in its low resistance state. When it is desired to store a logic one in device 12, device can once again be placed in its high resistance state by applying a voltage $V_{RESET}$ to device 12. When read and write circuitry 14 applies $V_{RESET}$ to device 12, device 12 enters its high resistance state HRS, as indicated by dashed line 32. When the voltage $V_{RESET}$ is removed from device 12, device 12 will once again be characterized by high resistance line HRS 26.

The bistable resistance of resistive switching memory element 12 makes memory element 12 suitable for storing digital data. Because no changes take place in the stored data in the absence of application of the voltages $V_{SET}$ and $V_{RESET}$, memory formed from elements such as element 12 is non-volatile.

Any suitable read and write circuitry and array layout scheme may be used to construct a nonvolatile memory device from resistive switching memory elements such as element 12. For example, horizontal and vertical lines 16 and 18 may be connected directly to the terminals of resistive switching memory elements 12. This is merely illustrative. If desired, other electrical devices may be associated with each element 12.

Figure 4:
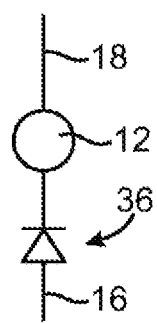
FIG. 4 is a schematic diagram of an illustrative resistive switching memory element in series with a diode in accordance with an embodiment of the present invention.

An example is shown in FIG. 4. As shown in FIG. 4, a diode 36 may be placed in series with resistive switching memory element 12. Diode 36 may be a Schottky diode, a p-n diode, a p-i-n diode, or any other suitable diode.

Figure 5:
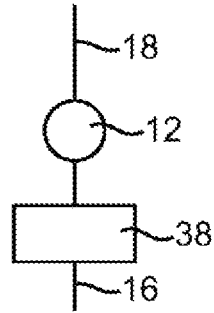
FIG. 5 is a schematic diagram of an illustrative resistive switching memory element in series with an electrical device in accordance with an embodiment of the present invention.
Figure 6:
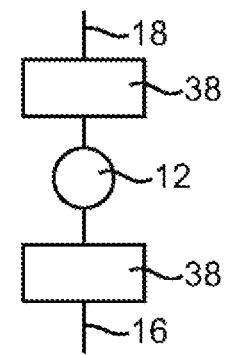
FIG. 6 is a schematic diagram of an illustrative resistive switching memory element in series with two electrical devices in accordance with an embodiment of the present invention.

If desired, other electrical components can be formed in series with resistive switching memory element 12. As shown in FIG. 5, electrical device 38 may be placed in series with resistive switching memory element 12. Device 38 may be a diode, a transistor, or any other suitable electronic device. Because devices such as these can rectify or otherwise alter current flow, these devices are sometimes referred to as rectifying elements or current steering elements. As shown in FIG. 6, two electrical devices 38 may be placed in series with a resistive switching memory element 12.

Memory elements 12 may be formed in a single layer in array 10 or may be formed in multiple layers. An advantage of forming memory arrays such as memory array 10 of FIG. 1 using a multi-layer memory element scheme is that this type of approach allows memory element density to be maximized.

If desired, a resistive switching metal oxide layer may be formed above or below a diode (as an example). Conductive lines 16 and 18 may be electrically coupled to metal oxide 22 through a number of layers of conductive material. There may, in general, be any suitable number of conductive layers associated with resistive switching memory element 12. These conductive layers may be used for functions such as adhesion promotion, seed layers for subsequent electrochemical deposition, diffusion barriers to prevent undesired materials from diffusing into adjacent structures, contact materials (e.g., metals, metal alloys, metal nitrides, etc.) for forming ohmic contacts with the metal oxide 22, contact materials (e.g., metals, metal alloys, metal nitrides, etc.) for forming Schottky contacts to the metal oxide 22, etc.

The conductive layers in element 12 may be formed from the same conductive material or different conductive materials. For example, the conductive layers of element 12 that contain metal may include the same metal or different metals. Moreover, conductive layers in element 12 may be formed using the same techniques or different techniques. As an example, one layer of metal may be formed using physical vapor deposition (PVD) techniques (e.g., sputter deposition), whereas another layer of metal may be formed using electrochemical deposition.

The portions of the conductive layers in element 12 that are immediately adjacent to resistive switching layer 22 or are otherwise in close association with layer 22 are sometimes referred to as the electrodes of the resistive switching memory element 12.

In general, the electrodes of resistive switching memory element 12 may each include a single material (e.g., a given metal), may each include multiple materials (e.g., titanium nitride), may include materials formed using different techniques (e.g., electrochemically deposited nickel and PVD nickel), or may include combinations of such materials.

Certain metals are particularly appropriate for forming metal oxide 22. These metals may include, for example, the transition metals and their alloys. With one particularly suitable arrangement, the metals for forming metal oxide 22 include titanium. The metal oxide 22 may include other elements in addition to titanium. For example, metal oxide 22 may include titanium, oxygen, and nitrogen. Metals other than titanium may also be used for metal oxide 22. Titanium-based metal oxides 22 are sometimes described herein as an example.

Any suitable conductive materials may be used for forming the electrodes 20 and 24 of resistive switching memory element 12. Illustrative conductive materials include transition metals (and their nitrides), refractory metals (and their nitrides), noble metals, and near-noble metals. Illustrative examples of conductive materials include Ti, Ta, W, Mo, Hf, Nb, Ni, Pd, Pt, Re, Ru, and Ir. Illustrative metal nitrides include titanium nitride, tantalum nitride, tungsten nitride, and molybdenum nitride. These are merely illustrative examples of materials that may be used for electrodes 20 and 24. Combinations of two or more of these materials (and/or their nitrides) may be used or other suitable conductive materials may be used as electrodes 20 and 24, if desired.

The electrodes 20 and 24 and other conductive layers that may be associated with elements 12 may be formed using any suitable techniques. Illustrative conductive material fabrication techniques include physical vapor deposition (e.g., sputter deposition, evaporation), chemical vapor deposition, atomic layer deposition, and electrochemical deposition (e.g., electroless deposition, electroplating). Metal oxide 22 may be formed by oxidizing one or more of these conductive materials.

With one particularly suitable arrangement, which is described herein as an example, the oxygen that is used in forming resistive switching metal oxide layer 22 may be provided from a deposited layer of oxide. This type of approach is illustrated in connection with FIGS. 7, 8, and 9.

Figure 7:
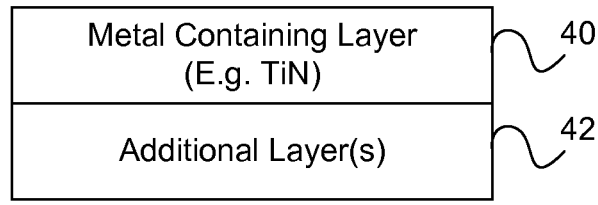
FIGS. 7, 8, and 9 are cross-sectional side views of an illustrative resistive switching memory element during fabrication in accordance with an embodiment of the present invention.

As shown in FIG. 7, a metal-containing layer 40 may be deposited on layer 42. During subsequent operations, layer 40 may be oxidized by heating layer 40 in the presence of an adjacent oxide layer.

Layer 42 may include one or more layers of material such as a substrate material (e.g., silicon, glass, etc.), conductors such as conductors 20, 24, 16, and 18 of FIGS. 2A and 2B, etc. Metal-containing layer 40 may contain any metal such as titanium that is suitable for forming a resistive switching layer when oxidized. An example of a suitable material for metal-containing layer 40 is titanium nitride (TiN). An advantage of a metal-containing layer such as titanium nitride is that portions of the metal-containing layer of this type may remain unoxidized following heat treatment (i.e., as titanium nitride) and may therefore be suitable for use in forming all or part of conductors such as conductors 20, 24, 16, and 18 of FIGS. 2A and 2B. The use of titanium nitride in metal-containing layer 40 is merely illustrative. Any suitable materials may be used in metal-containing layer 40. For example, metal-containing layer 40 may include multiple metals (i.e., a metal alloy) and the metal or metals of layer 40 may, if desired, be combined with any suitable additional materials (e.g., nitrogen, etc.). Examples of suitable resistive switching metal oxides that may be formed from heating layer 40 in the presence of an adjacent oxide layer include $TiO_x$, $AlO_x$, $HfO_x$, $TaO_x$, $ZrO_x$, $VO_x$, $NbO_x$, $CrO_x$, $MoO_x$, $WO_x$, $MnO_x$, and $MoO_x$. The metal oxides that are formed may include multiple metals, nitrogen, etc.

Metal-containing layer 40 may be formed on layer 42 using any suitable technique such as physical vapor deposition (e.g., sputter deposition, evaporation), chemical vapor deposition, atomic layer deposition, and electrochemical deposition (e.g., electroless deposition or electroplating). The thickness of metal-containing layer 40 is typically less than a few microns. For example, metal-containing layer 40 may have a thickness of tens, hundreds, or thousands of angstroms (as an example). Metal-containing layer 40 may contain one or more sublayers of material. With one illustrative arrangement, which is sometimes described herein as an example, metal-containing layer 40 is formed from a single layer of titanium nitride or other suitable material.

Figure 8:
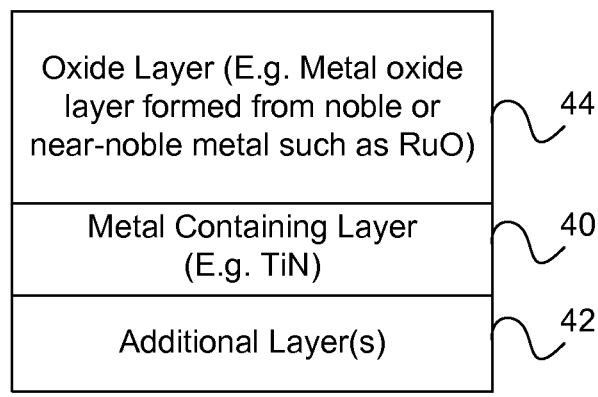

After metal-containing layer 40 has been deposited on layer 42, oxide layer 44 may be deposited on metal-containing layer 40. This type of configuration is shown in FIG. 8. Oxide layer 44 may include any oxygen-containing materials that can serve as suitable sources of oxygen for a resistive switching layer. As an example, oxide layer 44 may include a metal oxide layer such as a binary metal oxide layer. If desired, the metal oxide of layer 44 may be formed from a noble metal or near-noble metal. For example, layer 44 may be formed from a noble metal oxide such as ruthenium oxide ($RuO_x$). Another example of a suitable metal oxide material is iridium oxide ($IrO_x$).

Any suitable technique may be used for forming oxide layer 44 on metal-containing layer 40. Examples of such techniques include physical vapor deposition (e.g., sputter deposition, evaporation), chemical vapor deposition, atomic layer deposition, and electrochemical deposition (e.g., electroless deposition or electroplating). Oxide layer 44 may be formed to any suitable thickness (e.g., microns, hundreds or thousands of angstroms, etc.).

After the multilayer structure of FIG. 8 has been formed, heat may be applied. Any suitable technique may be used for applying heat to the multilayer structures of FIG. 8. As an example, the heat may be applied by placing the structures in a furnace. If desired, heat may be applied using a rapid thermal annealing (RTA) tool. In a typical rapid thermal anneal (RTA) process, the structures may be heated to a temperature of 750° C. for about one minute (as an example). Heat treatment may be performed in the presence of an annealing ambient (e.g., argon) or any other suitable atmosphere. Heat may be applied for any suitable length of time (e.g., more than 10 seconds, less than one minute, more than one minute, etc.). The maximum temperature to which the structures are raised may be greater than 400° C., greater than 600° C., less than 750° C., may be equal to 750° C., or may be more than 750° C.

Figure 9:
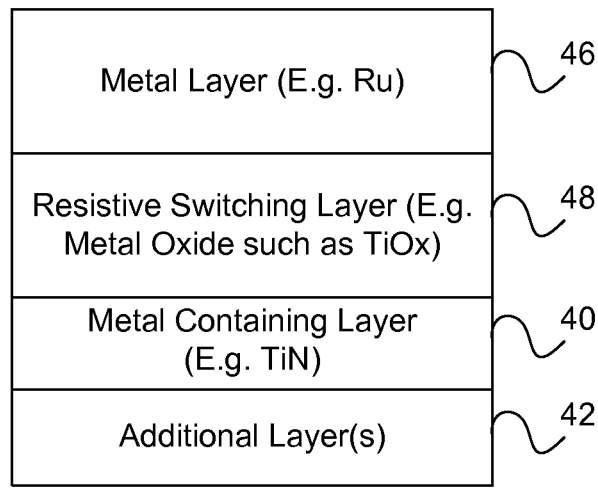

When heat is applied to the structures of FIG. 8, oxide layer 44 reacts with layer 40. For example, consider a scenario in which oxide layer 44 is formed from ruthenium oxide and in which metal-containing layer 44 is formed from titanium nitride. In this type of situation, heat treatment can cause the ruthenium oxide to react with the titanium nitride layer. As these layers react with each other, the oxygen from the ruthenium oxide layer (i.e., layer 44) can react with the titanium from the titanium nitride layer (i.e., layer 40) to form a resistive switching metal oxide layer 48 of titanium oxide, as shown in FIG. 9. It is understood that resistive switching, according to various mechanisms, may occur in regions of the memory element other than the resistive switching metal oxide layer 48. Because the reaction process depletes oxygen from metal oxide layer 44, a layer of metal such as metal layer 46 of FIG. 9 may remain on top of resistive switching layer 48 following heat treatment. In particular, a layer of ruthenium may remain on top of the titanium oxide layer 48 that is formed from the reaction of the oxygen from ruthenium oxide layer 44 and the titanium from titanium nitride layer 40. In the event that some of the titanium nitride layer 40 does not react with the oxygen, a portion of unoxidized metal-containing layer 40 may remain on top of additional layer 42, as shown in FIG. 9. It is not necessary for the oxidation reaction to consume all of the oxygen in layer 44. For example, a metal oxide in oxide layer 44 such as ruthenium oxide may only partially disassociate during heating so that a layer 46 is produced that is made up of a mixture of ruthenium and ruthenium oxide. The partial disassociation may result in the oxide layer 44 forming a bilayer 46 having a layer of ruthenium adjacent to the resistive switching layer 48 and a layer of ruthenium further from the resistive switching layer 48. The two layers of ruthenium may be separated by a residual ruthenium oxide layer. According to other embodiments, other mixtures of the layer 46 are possible, include regions of a solid solution of ruthenium metal and ruthenium oxide.

If desired, resistive switching metal oxide structures may be formed by heating multiple layers of metal-containing material in the presence of one or more layers of oxide. For example, multiple metal-containing layers such as layer 40 may be deposited beneath the oxide layer 44. With this type of approach, two, three, or more than three metal oxide layers and a metal overlayer (e.g., an electrode) can be formed.

Following heat treatment, metal from each of the metal-containing layers 40 may be oxidized by oxygen from the adjoining oxide layer 44. This approach can be used to form structures with metal oxide layers formed from the same materials or different materials.

Figure 10:
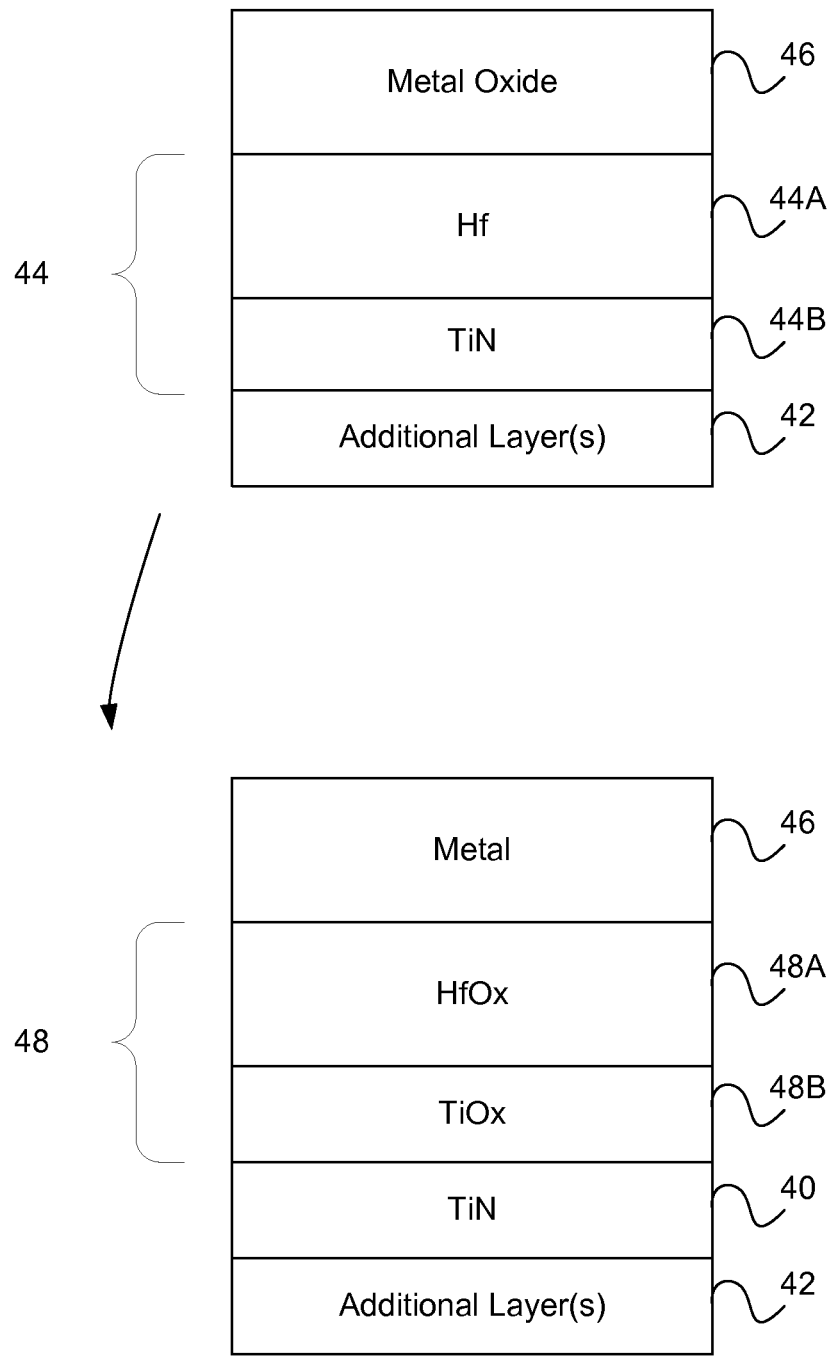
FIG. 10 is a cross-sectional side view of another illustrative resistive switching memory element during fabrication in accordance with an embodiment of the present invention.

If desired, layer 40 and/or layer 44 may be formed from multiple sublayers, as shown by illustrative sublayers 44 in FIG. 10. In situations in which the oxide layer 44 is formed from multiple oxide sublayers, the oxygen from each sublayer may be used in oxidizing the metal of metal-containing layer(s) 40 (including any sublayers of these layers). In situations in which layer 44 is formed from multiple metal-containing sublayers, the oxygen from the oxide may be used in oxidizing each of the metal-containing sublayers. Some or all of the oxygen in each oxide sublayer may be consumed and some or all of the metal in each metal-containing sublayer may be consumed during heat treatment.

An illustrative arrangement in which layer 44 is made up of multiple sublayers is shown in FIG. 10. In this example, layer 44 includes two sublayers. Layer 44A is formed from hafnium. Layer 44B is formed from titanium nitride. The use of two sublayers (layers 44A and 44B) and the use of hafnium and titanium nitride as the materials in these metal-containing layers is merely illustrative. Layer 44 may, in general, include any suitable number of sublayers and such sublayers may be formed from any suitable metal-containing materials.

As shown in the upper portion of FIG. 10, an oxide layer 46 such as a metal oxide layer may be formed on top of the sublayers in layer 44. This structure may be heated in a furnace or rapid thermal annealing tool. During heating, oxygen from oxide layer 40 may oxidize the hafnium in layer 44A and may oxidize the titanium in titanium nitride layer 44B.

Depending on process conditions such as the amount of heat applied and the length of heating, the oxide layer 46 may partially or fully disassociate and the metal containing layers 44A and 44B may partially or fully oxidize. In the example shown in the lower half of FIG. 10, oxide layer 46 has completely disassociated, so only metal M remains in layer 46 following heating. Hafnium layer 44A has oxidized to form hafnium oxide layer 48A. Some of the titanium in titanium nitride layer 44B has oxidized to form titanium oxide layer 48B. A residual layer 40 of titanium nitride has not been oxidized and remains under layer 48B.

As this example demonstrates, during heat treatment, oxygen from oxide layer 46 may oxidize both sublayers 44A and 44B in metal-containing layer to produce corresponding metal oxide sublayers 48A and 48B in resistive switching metal oxide layer 48. If desired, this approach may be used with oxide layers 40 that include multiple sublayers and/or with stacks that include multiple alternating layers 40 and 44 (with or without sublayers in each oxide layer and/or metal-containing layer).

An advantage of the structures formed in FIGS. 9 and 10 is that the heat treatment results in the in-situ formation of a multilayer resistive switching structure (i.e., the structures shown in FIGS. 9 and 10) with potentially smooth interfaces between layers. The structure of FIG. 9, for example, may be used as a nonvolatile resistive switching memory element, because it contains a resistive switching layer 48 that is located between two conductive layers (e.g., metal layer 46 and metal-containing layer 40 and/or conductive layer(s) in layer 42). The interfaces formed between layers 46 and 48 and between layers 48 and 40 may be smooth and may exhibit good adhesion properties, because they avoid the rough oxide/metal interfaces and poor adhesion that are often encountered when depositing metal oxides on metal layers and vice versa.

Figure 11:
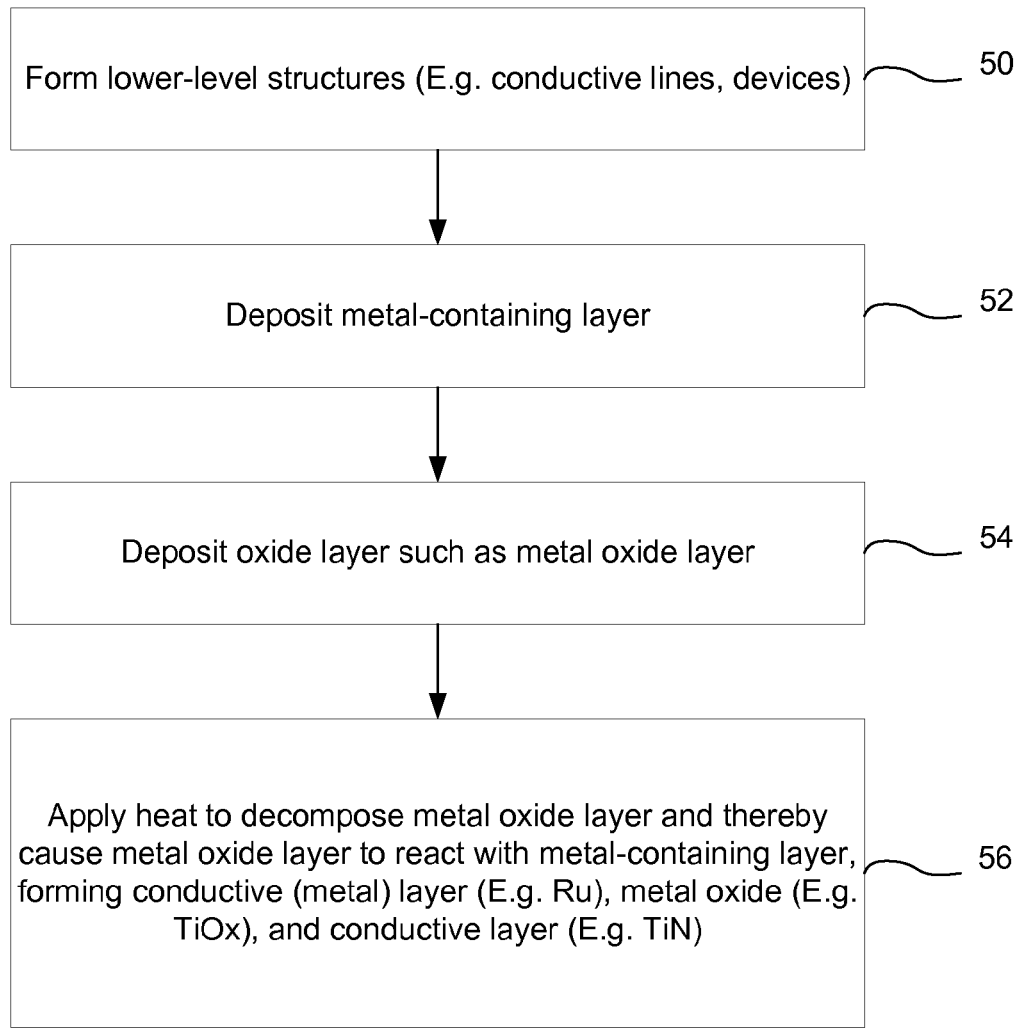
FIG. 11 is a flow chart of illustrative steps involved in fabricating a resistive switching memory element in accordance with an embodiment of the present invention.

Illustrative steps involved in forming resistive switching metal oxide structures by heating layers of oxide and metal-containing material are shown in FIG. 11.

At step 50, one or more lower-level layers of material such as a substrate material (e.g., silicon, glass, etc.), conductors such as conductors 20, 24, 16, and 18 of FIGS. 2A and 2B, etc. may be formed.

At step 52, a metal-containing layer 40 may be formed on top of the lower-layer layers. The metal-containing layer 40 may include any suitable metal or metals (e.g., a metal, a metal alloy, etc.), and optional additional materials (e.g., nitrogen). Examples of metals that may be included in layer 40 include, Ti, Al, Hf, Ta, Zr, V, Nb, Cr, Mo, W, Mn, and Mo (as examples). Layer 40 may include a single layer of material or multiple sublayers of materials.

During step 52, metal-containing layer 40 may be formed on layer 42 using any suitable technique such as physical vapor deposition (e.g., sputter deposition, evaporation), chemical vapor deposition, atomic layer deposition, and electrochemical deposition (e.g., electroless deposition or electroplating).

At step 54, oxide layer 44 may be deposited on metal-containing layer 40. Oxide layer 44 may be formed as a single layer of material or may include multiple sublayers of materials. As described in connection with FIG. 8, oxide layer 44 may include any oxygen-containing materials that can serve as suitable sources of oxygen for a resistive switching layer such as ruthenium oxide, iridium oxide, etc. Suitable techniques for forming oxide layer 44 on metal-containing layer 40 include physical vapor deposition (e.g., sputter deposition, evaporation), chemical vapor deposition, atomic layer deposition, and electrochemical deposition (e.g., electroless deposition or electroplating).

If desired, steps such as steps 52 and 54 may be repeated one or more times to form a multilayer structure (e.g., a structure in which the layer 40 contains multiple metal layers and/or in which the layer 44 contains multiple metal oxide layers).

At step 56, heat may be applied to the layers by placing the structures in a furnace or using a rapid thermal annealing (RTA) tool. During heating, one or more resistive switching metal oxide switching layers may be formed. In particular, some or all of the oxygen from the oxide layer(s) 44 may oxidize some or all of the metal in metal-containing layer 40 (including the metal in any sublayers within layer 40). The resulting structures may include a residual layer formed from oxide layer 44 such as residual layer 46. Residual layer 46 may, for example, include residual metal and/or metal oxide from layer 44. In situations in which the oxygen from oxide layer 44 is fully consumed, layer 46 may include only metal (or a metal alloy). In situations in which the oxygen from oxide layer 44 is partially consumed, layer 46 may include residual (unconsumed) oxide such as a layer of unconsumed metal oxide (as an example). Similarly, metal-containing layer 40 may or may not be fully consumed during processing. In situations in which metal-containing layer 40 is only partially consumed, a portion of the metal-containing layer may remain in the resistive switching memory element structure, as shown in FIG. 9.

The foregoing is merely illustrative of the principles of this invention and various modifications can be made by those skilled in the art without departing from the scope and spirit of the invention.

What is claimed:

1. A method for fabricating a resistive switching memory element, comprising:

forming a first layer that contains a first metal;

forming a second layer that contains a second metal and oxygen;

forming a resistive switching layer by heating the first and second layers so that the oxygen from the second layer oxidizes the first metal; and forming a metal layer from the second metal, wherein forming the metal layer comprises forming a second electrode.

2. The method defined in claim 1 wherein forming the second layer comprises forming a metal oxide.

3. The method defined in claim 1 wherein forming the second layer comprises forming a binary metal oxide.

4. The method defined in claim 1 wherein forming the first layer comprises forming a metal nitride and wherein forming the second layer comprises forming a metal oxide.

5. The method defined in claim 1 wherein forming the first layer comprises forming a metal nitride, wherein forming the second layer comprises forming a metal oxide, and wherein forming the resistive switching layer comprises heating the first and second layers sufficiently that the oxygen from the second layer oxidizes the first metal of the first layer to form a metal oxide that exhibits resistive switching.

6. The method defined in claim 5 wherein heating the first and second layers sufficiently comprises heating the first and second layers using rapid thermal annealing.

7. The method defined in claim 6 wherein heating the first and second layers to generate a layer adjacent to the resistive switching metal oxide formed of only the metal of the second layer.

8. The method defined in claim 6 wherein heating the first and second layers using rapid thermal annealing comprises heating the first and second layers to generate a layer adjacent to the resistive switching metal oxide formed of the second metal of the second layer while leaving a portion of the first layer unoxidized.

9. The method defined in claim 1 further comprising:

forming at least one additional layer that contains metal between the first layer and the second layer; and while heating the first and second layers, heating the additional layer so that the oxygen from the second layer oxidizes the metal from the additional layer.

10. The method defined in claim 1 wherein the first layer contains multiple metals and wherein forming the resistive switching metal oxide layer comprises oxidizing the multiple metals with the oxygen from the second layer by heating the first and second layers.

* * * * *